(12) United States Patent
Marti et al.

(10) Patent No.: US 11,742,797 B2
(45) Date of Patent: Aug. 29, 2023

(54) SYSTEM FOR EVALUATING HARDWARE (71) Applicant: UT-Battelle, LLC, Oak Ridge, TN (US)

(72) Inventors: Shilpa Marti, Oak Ridge, TN (US); Rafal P. Wojda, Oak Ridge, TN (US); Suman Debnath, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 17/666,949

(22) Filed: Feb. 8, 2022

(65) Prior Publication Data

US 2022/0255503 A1   Aug. 11, 2022

Related U.S. Application Data

(60) Provisional application No. 63/147,251, filed on Feb. 9, 2021.

(51) Int. Cl.
*H02J 7/00* (2006.01)
*H02S 50/00* (2014.01)
*H02J 3/38* (2006.01)
*H02M 3/155* (2006.01)
*G01R 21/06* (2006.01)
*H02J 3/01* (2006.01)

(52) U.S. Cl.
CPC .............. *H02S 50/00* (2013.01); *G01R 21/06* (2013.01); *H02J 3/01* (2013.01); *H02J 3/381* (2013.01); *H02M 3/155* (2013.01); *H02J 2300/24* (2020.01)

(58) Field of Classification Search
CPC ....... H02S 50/00; H02J 3/381; H02J 2300/24; H02J 3/01; H02M 3/155; G01R 2/106
See application file for complete search history.

(56) References Cited

U.S. PATENT DOCUMENTS

| | | | |
|---|---|---|---|
| 2011/0193515 A1* | 8/2011 | Wu ........................... | H02J 7/35 320/101 |
| 2022/0052604 A1* | 2/2022 | Adest ...................... | H02M 7/44 |
| 2022/0181884 A1* | 6/2022 | Wang ...................... | H02J 3/381 |

* cited by examiner

*Primary Examiner* — Jared Fureman
*Assistant Examiner* — Esayas G Yeshaw
(74) *Attorney, Agent, or Firm* — Warner Norcross + Judd LLP (57) ABSTRACT

A system for evaluating a power electronics module, such as a photovoltaic (PV) module or an energy-storage system (ESS) module, is provided. The power electronics module may form a component of a multiport autonomous reconfigurable solar (MARS) power plant, which may include a plurality of phase-legs each including an upper arm and the lower arm.

22 Claims, 4 Drawing Sheets

SYSTEM FOR EVALUATING HARDWARE

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

FIELD OF INVENTION

The present disclosure relates to the field of evaluating hardware-in-the-loop (HIL), and more particularly to HIL evaluation of submodules (SM), such as photovoltaic (PV) systems or electronic storage system (ESSs).

BACKGROUND

Photovoltaic (PV) and energy storage systems (ESS) are being connected to transmission ac grids and high voltage dc (HVdc) through a Multiport Autonomous Reconfigurable Solar (MARS) power plant. The MARS power plant may include a conventional submodule (SM), a PV SM, or an ESS SM, or any combination thereof. The PV SM may connect to PV, and the ESS SM may connect to the ESS. The performance and functional capabilities of these building blocks may reflect on the overall performance and capabilities of the MARS power plant. However, building a full-scale MARS power plant or testing even one arm of the MARS power plant's converter can be time-consuming and costly. The high costs are associated with the presence of a very large number of SMs in the MARS power plant, which are of the order of several 100s to a few 1000s.

There are a few conventional evaluation platforms available to evaluate SMs in modular multi-level converters (MMCs). However, these conventional evaluation platforms do not consider the unique architecture introduced in a MARS power plant that incorporate PV and ESS SMs along with conventional SMs. The evaluation platform for SMs in MMCs are for conventional SMs only. In other words, the conventional evaluation platform is configured specific to the circuit topology of a conventional SM and is not capable of evaluating different types of SMs, such as the PV SM or the ESS SM, that have different topology.

SUMMARY

In general, one innovative aspect of the subject matter described herein can be embodied in a system for characterizing a multiport autonomous reconfigurable solar (MARS) power plant to be formed from a plurality of power-electronic modules electrically connected in series to adjacent ones along one or more arms, each arm may include one or more photovoltaic (PV) modules to be electrically connected to corresponding PV panels associated with the MARS power plant, one or more energy-storage system (ESS) modules to be electrically connected to energy storage associated with the MARS power plant, and at least one additional module different from both a PV module and an ESS module. The characterizing of the MARS power plant may be performed using only a test module from among the one or more PV modules or the one or more ESS modules or the one or more additional modules, where the test module may include an input port and an output port, and where if the test module were operated as part of the MARS power plant, then an arm current through the test module would have predetermined current values, and a module voltage at the output port of the test module would have predetermined voltage values. The system may include amplifier circuitry configured to: electrically connect to the test module and, when connected to the test module, output an amplifier current corresponding to the predetermined current values of the arm current, and output, when providing the amplifier current to the test module, an amplifier voltage corresponding to the predetermined voltage values of, and being out of phase with, the module voltage.

The foregoing and other embodiments can each optionally include one or more of the following features, alone or in combination. In particular, one embodiment includes all the following features in combination.

In some embodiments, the amplifier circuitry may include current source circuitry that includes an H-bridge, and filtering circuitry electrically connected at outputs of the current source circuitry and configured to filter harmonics produced by the H-bridge. The amplifier circuitry may include module-voltage cancelation circuitry electrically connected to a first output of the filtering circuitry and configured to cause the amplifier voltage to correspond to the predetermined voltage values of, and to be out of phase with, the module voltage. The amplifier circuitry may include a first stress inductor electrically connected between the output of the module-voltage cancelation circuitry and a first output of the amplifier circuitry, and a second stress inductor electrically connected between a second output of the filtering circuitry and a second output of the amplifier circuitry.

In some embodiments, the test module may include a PV module that includes a front-end half bridge and a dc/dc converter, where the module-voltage cancelation circuitry includes a corresponding front-end half bridge and a corresponding dc/dc converter.

In some embodiments, the amplifier circuitry may include gate-driver circuitry configured to drive gates of the H-bridge, gates of the front-end half bridge, and gates of the dc/dc converter.

In some embodiments, the amplifier circuitry may include controller circuitry configured to control the gate-driver circuitry based on a current signal corresponding to the arm current to cause currents at the outputs of the current source circuitry to follow the arm current.

In some embodiments, the amplifier circuitry may include sensing circuitry communicatively coupled to the controller circuitry and configured to measure the current through the outputs of the current source circuitry and a voltage in the filter circuitry, and feedback values of the measured current and voltage to the controller circuitry.

In some embodiments, the controller circuitry may be communicatively coupled with a signal generator and configured to receive from the signal generator the current signal corresponding to the arm current.

In some embodiments, the MARS power plant may include hundreds of identical PV modules, hundreds of identical ESS modules, or hundreds of the additional modules.

In general, one innovative aspect of the subject matter described herein can be embodied in an evaluation system for evaluating a power electronics module. The power electronics module may be capable of receiving power and generating a high-voltage output, and the power electronics module may be operable, in a power system separate from the evaluation system, to generate and receive power in conjunction with a plurality of power electronics modules.

The evaluation system may include a current source operable to supply current to the power electronics module, where the current source may be configured to direct power received from a first power source to the power electronics module. The current source may include a source output configured for operation below a voltage threshold that is less than the high-voltage output of the power electronics module. The system may include a controller operably coupled to the current source, where the controller may be operable to direct supply of current to the power-electronics module. The system may include switching circuitry operably coupled to the current source and the power-electronics module. The switching circuitry may be operable to sink power produced by the power-electronics module into a second power source in order to maintain the source output at a voltage below the voltage threshold.

The foregoing and other embodiments can each optionally include one or more of the following features, alone or in combination. In particular, one embodiment includes all the following features in combination.

In some embodiments, the switching circuitry may be configured to generate power, and where the power-electronics module is operable to sink power generated by the switching circuitry.

In some embodiments, the power electronics module may be operable to generate a module voltage at the high-voltage output. The switching circuitry may be configured to generate an anti-module voltage that is out of phase with the module voltage.

In some embodiments, the anti-module voltage may substantially cancel the module voltage of the power electronics module, and where the power output from the power electronics module may be provided to the second power source.

In some embodiments, the first and second power sources may be different.

In some embodiments, the second power source may be a bidirectional power source.

In some embodiments, the current source may include inverter circuitry operable to supply current to the power electronics module via the source output at a source frequency and a source phase, where the current provided via the source output is based on a voltage output from the inverter circuitry and an impedance seen by the source output.

In some embodiments, the switching circuitry may be operable to prevent the power electronics module from substantially affecting the impedance seen by the source output irrespective of whether the power electronics module is receiving or generating power.

In general, one innovative aspect of the subject matter described herein can be embodied in a module switching system operable to cancel voltage and sink power output from a power electronics module. The power electronics module may be configured to receive current from a current source via a source output of the current source, and the current source may be configured for operation below a voltage threshold that is less than a high-voltage output of the power electronics module.

The module switching system may include switching circuitry configured to be coupled to the current source and the power-electronics module. The switching circuitry may be operable to sink power produced by the power-electronics module into a power source, and may be operable in a first mode to maintain the source output at a voltage below the voltage threshold. The power electronics module may be generating voltage greater than the voltage threshold in the first mode.

The module switching system may include a controller operably coupled to the switching circuitry and operable to direct the switching circuitry, in the first mode, to direct power from the power electronics module to the power source.

The foregoing and other embodiments can each optionally include one or more of the following features, alone or in combination. In particular, one embodiment includes all the following features in combination.

In some embodiments, the switching circuitry may be configured to generate power, and where the power-electronics module may be operable to sink power generated by the switching circuitry.

In some embodiments, the controller may be operable to direct the switching circuitry, in the first mode, to maintain the source output of the current source at a voltage below the voltage threshold.

In some embodiments, the switching circuitry may be operable in a second mode to allow the current source to provide current to the power electronics module.

In some embodiments, the switching circuitry may be operable to generate an anti-module voltage that is out of phase with voltage that is generated by the power electronics module.

In some embodiments, the switching circuitry may be a dc-dc converter operable to sink power generated by the power electronics module into the power source.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

DESCRIPTION

Figure 3:
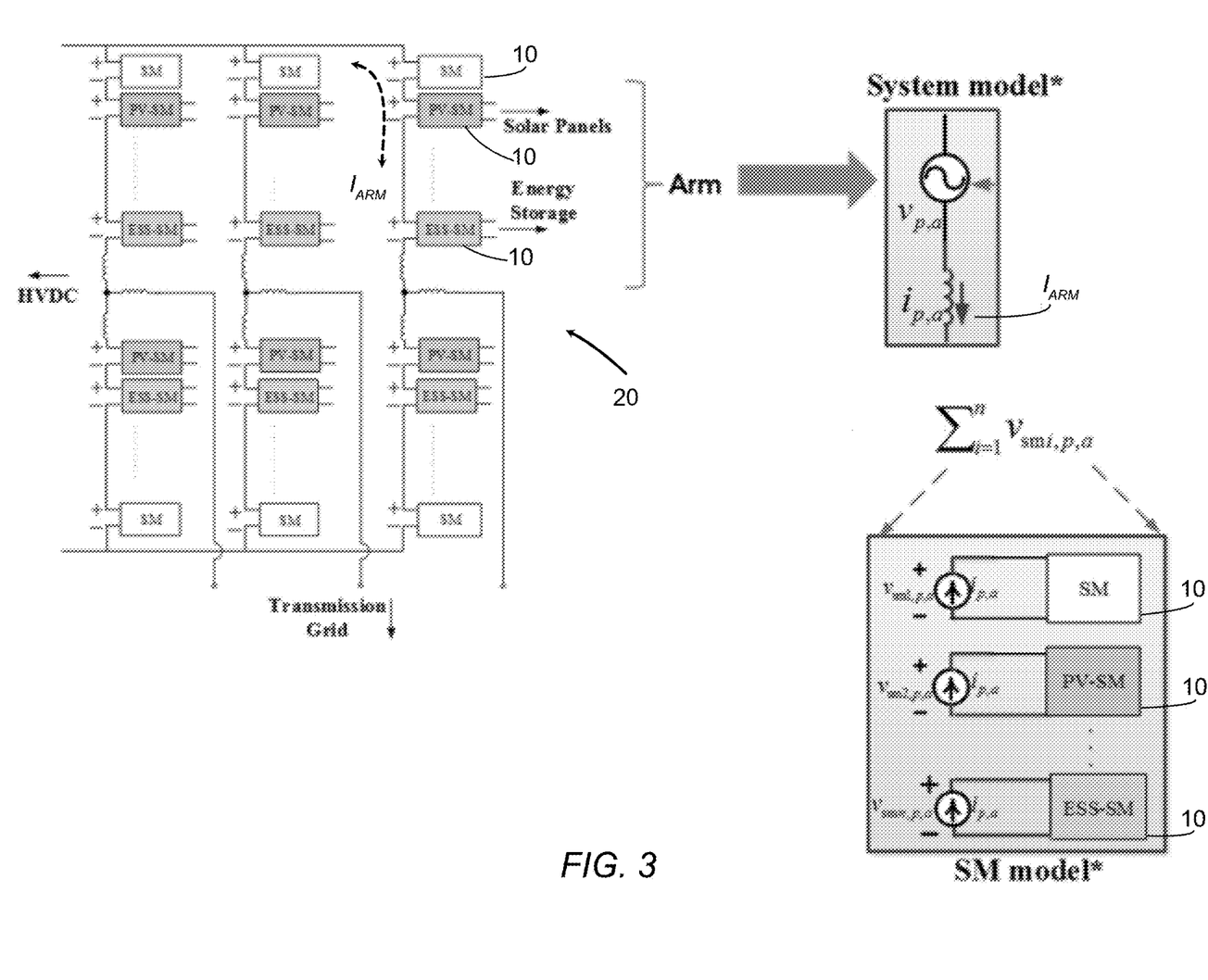
FIG. 3 shows a MARS power plant in one embodiment.

The present disclosure is directed to a system for evaluating a power electronics module, such as a photovoltaic (PV) SM or an energy-storage system (ESS) SM or a conventional SM. The power electronics module may form a component of a multiport autonomous reconfigurable solar (MARS) power plant or other similar multiport power electronics, which may include a plurality of phase-legs each including an upper arm and the lower arm. The upper and lower arms may include a plurality of series-connected power electronics modules, such as the PV SM or the ESS SM or the conventional SM, or a combination thereof. A partial, representative view of a MARS power plant 20 in accordance with one embodiment is shown in FIG. 3, including a plurality of upper and lower arms, each including a plurality of power electronics modules 10. As described herein, because each arm includes a plurality of power electronics modules 10 arranged in series, evaluating any one of the power electronics modules 10 in conjunction with the MARS power plant 20 can be time-consuming and costly. One embodiment according to the present disclosure includes a system for evaluating a power electronics module 10 separate from the MARS power plant 20 by emulating the arm current $I_{ARM}$ for an arm associated with the power electronics module 10 being evaluated. The arm current $I_{ARM}$ emulated during evaluation may be representative of the arm current $I_{ARM}$ flowing through an arm of the MARS power plant 20 that includes a plurality of power electronics modules 10 as depicted in illustrated embodiment of FIG. 3.

I. Overview

An evaluation system 100 in accordance with one embodiment of the present disclosure may be configured to couple to a power electronics module 10 and to emulate the arm current $I_{ARM}$ for evaluation of the power electronics module 10. The power electronics module 10 may be operable to receive active power, generate active power, and process reactive power. The arm current $I_{ARM}$ may be emulated during all modes of operation of the power electronics module 10, including a mode corresponding to reception of power, a mode corresponding to generation of power, and a mode corresponding to processing reactive power. The evaluation system 100, in this way, may be operable to evaluate an actual power electronics module 10 under operating conditions substantially similar to those of the MARS power plant 20. This type of evaluation may be considered a hardware-in-the-loop (HIL) evaluation of the power electronics module 10.

The evaluation system 100 may be configured for operation below a threshold voltage that is significantly lower than a voltage capable of being generated by the power electronics module 10. This way, cost and complexity of the evaluation system may be significantly less than alternative configurations operable for voltages commensurate with those of the power electronics module 10.

Figure 1:
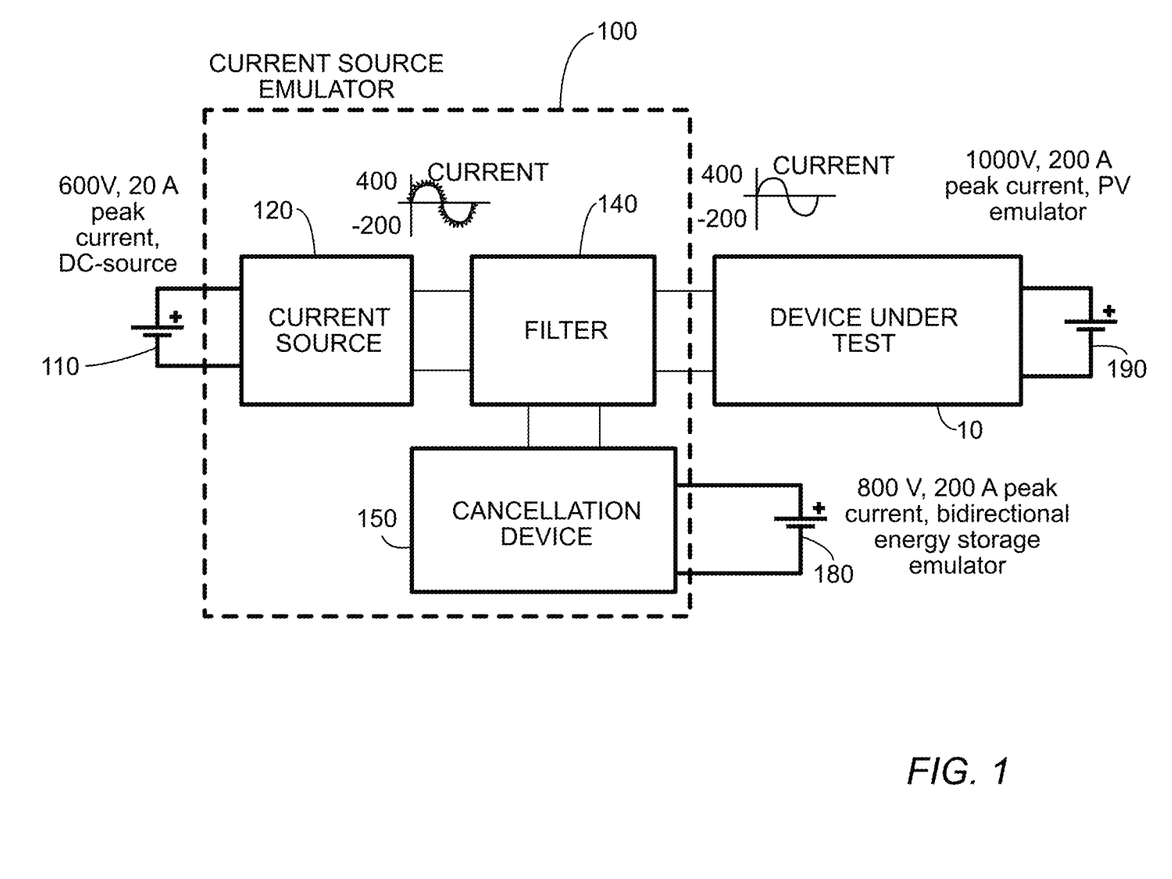
FIG. 1 shows an evaluation system in one embodiment according to the present disclosure.

The evaluation system 100 in one embodiment is depicted in FIG. 1 in conjunction with a power electronics module 10. The power electronics module 10 may be described as a device under test (DUT), and may be coupled to a module power element 190. The module power element 190 may be integrated into the power electronics module 10 or arranged separately from but connected to the power electronics module 10. The module power element 190 in the illustrated embodiment is a 1000 V DC power module capable of receiving or outputting 200 A, and represents a PV system operable to supply power based on light energy. The module power element 190 may be any component capable of storing power or generating power, or both. For instance, in an ESS SM, the module power element 190 may correspond to a battery capable of storing energy and supplying stored energy.

It is to be understood that the present disclosure is not limited to this particular configuration, and that the module power element 190 may be configured differently depending on the application.

The power electronics module 10 may include an SM, such as a conventional SM, a PV SM, or an ESS SM, and associated circuitry. The power electronics module 10 may include any type of SM configured for any type of power system (e.g., PV or ESS).

The evaluation system 100 may be coupled to a first power source 110 and a second power source 180. The first power source 110 may be a DC source capable of providing power for supply of the arm current $I_{ARM}$ to the power electronics module 10. The second power source 180, as described herein, may be operable to sink power generated or generate power received by switching circuitry 150, also described as a cancellation device or an anti-SM device. The first power source 110 in the illustrated embodiment is a 600 V DC source capable of generating 20 A. The second power source 180 in the illustrated embodiment is an 800 V DC source capable of generating 200 A. The first power source 110 and the second power source 180 may be configured differently depending on the application. The second power source 180 in the illustrated embodiment is a bidirectional source operable to both sink and source current, enabling the switching circuitry 150 to generate voltage signal to cancel or reduce a voltage generated by the power electronics module 10 and to divert power from the power electronics module 10 to the second power source 180.

The switching circuitry 150 may be operable to maintain a voltage seen by an output of the evaluation system 100 at or below a threshold voltage for operation of the evaluation system 100. This way, the power electronics module 10 may be evaluated without modification to operate at a voltage significantly less than the high-voltage operative mode of the power electronics module 10.

In one embodiment, the power electronics module 10 may be directed to generate power in a power generation mode instead of receiving power via the arm current provided $I_{ARM}$ by the evaluation source 100. The power electronics module 10 may utilize power from the module storage element 190 to generate power in this power generation mode. The switching circuitry 150 may be operable to maintain an output of the current source 120 at a voltage less than the high-voltage output of the power electronics module 10. Additionally, or alternatively, the switching circuitry may be operable to maintain another output of the evaluation system 100, different from the output of the current source 120, at a voltage less than the high-voltage output of the power electronics module 10.

As an example, the switching circuitry 150 may be configured to generate a voltage that is out of phase with a voltage generated by the power electronics module 10. The voltage generated by the switching circuitry 150 may also be commensurate in magnitude with the voltage generated by the power electronics module 10. By generating a voltage that is substantially the same in magnitude but out of phase with the voltage generated by the power electronics module 10, the switching circuitry 150 may effectively cancel the voltage generated by the power electronics module 10. As a result, the switching circuitry 150 may be operable to prevent the high-voltage that is output by the power electronics module from being seen by an output of the current source 120.

In one embodiment, an evaluation capability for components in the MARS power plant 20 may be provided as a way to improve SM architectures or implement state-of-the-art/ in-research semiconductor devices or control strategies, or any combination thereof. The evaluation system 100 may provide a platform for real-time HIL based evaluation of SM components (e.g., a power electronics module 10) in the MARS power plant 20.

The evaluation system 100 may be operable to validate proposed building blocks of a MARS power plant 20, such as individual SMs that can be connected to PV panels or ESS or is unconnected to any source in the MARS power plant 20. The power electronics module 10, as described herein may include only the SM or an SM in conjunction with another component such as a PV panel or ESS.

This evaluation capability of the evaluation system 100 may be described as a Power Electronics HIL (PE-HIL) system. The PE-HIL system may be configured for evaluation of a few power electronic SMs as an equipment, externally, and with the rest of the system (e.g., the MARS power plant 20 or aspects thereof) being evaluated in a real-time simulation capability. The PV-SM or ESS-SM may be identified as the DUT (e.g., a power electronics module 10) and can be evaluated with the MARS power plant 20 being evaluated in a real-time simulation capability. The architecture of PE-HIL is described in conjunction with the illustrated embodiment of FIG. 1. The high voltage of the SM may introduce voltage stress on the current source 120 and the filter stage 140. To reduce this voltage stress anti-SM in the form of switching circuitry 150 may be connected to the current source 120 through the filter stage 140 to cancel the output voltage of the SM. The topology of anti-SM (ASM) includes a dc-dc converter (e.g., switches 153, 154 and inductor 155) that sinks the current induced by the PV-SM coupled to the SM, which corresponds to the power electronics module 10 and is the DUT in the illustrated embodiment of FIG. 3.

The evaluation system 100 (e.g., PE-HIL) may facilitate design of the MARS power plant 20 (or other similar multiport power electronics). For instance, the evaluation system 100 may be a cost-effective option to enable demonstration of a proof of concept (using few SMs) prior to evaluating a complete plant composed of thousands of SMs. The evaluation system 100 may support design, rapid prototyping, and development of new SMs that can integrate many energy sources (like PV and ESS). The evaluation system 100 may enable evaluation of a new control architecture and associated bandwidth. The evaluation system 100 may also enable evaluation of new protection algorithms and components. It is to be understood that the present disclosure is not limited to evaluation and design of a MARS power plant 20; for instance, the evaluation system 100 may be utilized to facilitate design of any type of multiport power electronics system.

The evaluation system 100 may be used as a current source amplifier that can source or sink power and cancel high voltages based on the characteristics of the DUT. The evaluation system 100 can be used as an arm current emulator for testing and validating individual SMs in HVdc applications with PV/ESS sources. The current source can also be utilized to evaluate SMs in series connected modular configuration in multiport power electronics that includes applications such extreme fast charging stations (XFC), PV and ESS connected SMs in MARS-type systems for distribution/transmission grids.

II. MARS Power Plant and Power Electronics Module

The MARS power plant 20 in the illustrated embodiment includes three phase-legs connecting to HVdc and transmission ac grids. Each phase-leg includes two arms: upper and lower arms. And, each arm includes several series-connected power electronics modules 10 in the form of SMs in series with an inductor. The SMs in each arm can be of three types: (i) a PV-SM that connects to string of PV panels, (ii) an ESS-SM that connects to energy storage, and (iii) a conventional SM that is not connected to any PV panel or energy storage. Control of the MARS power plant 20 may be based on a hierarchical system that includes (i) L-1 controller, (ii) L-2 controller, and (iii) L-3 controller. The L-1 controller may receive power dispatch commands from a system operator that includes power transferred to an ac side ($P_{ac;ref}$), power transferred to a dc side ($P_{dc;ref}$), and a reactive power provided to the ac side ($Q_{ac;ref}$).

An evaluation system 100 may be configured to evaluate building blocks (e.g., power electronics modules) of the MARS power plant 20, such as like PV-SM or ESS-SM. This evaluation capability may provide HIL for the power electronics modules 10. PV-SM or ESS-SM is identified as the DUT or the power electronics module 10.

Figure 4:
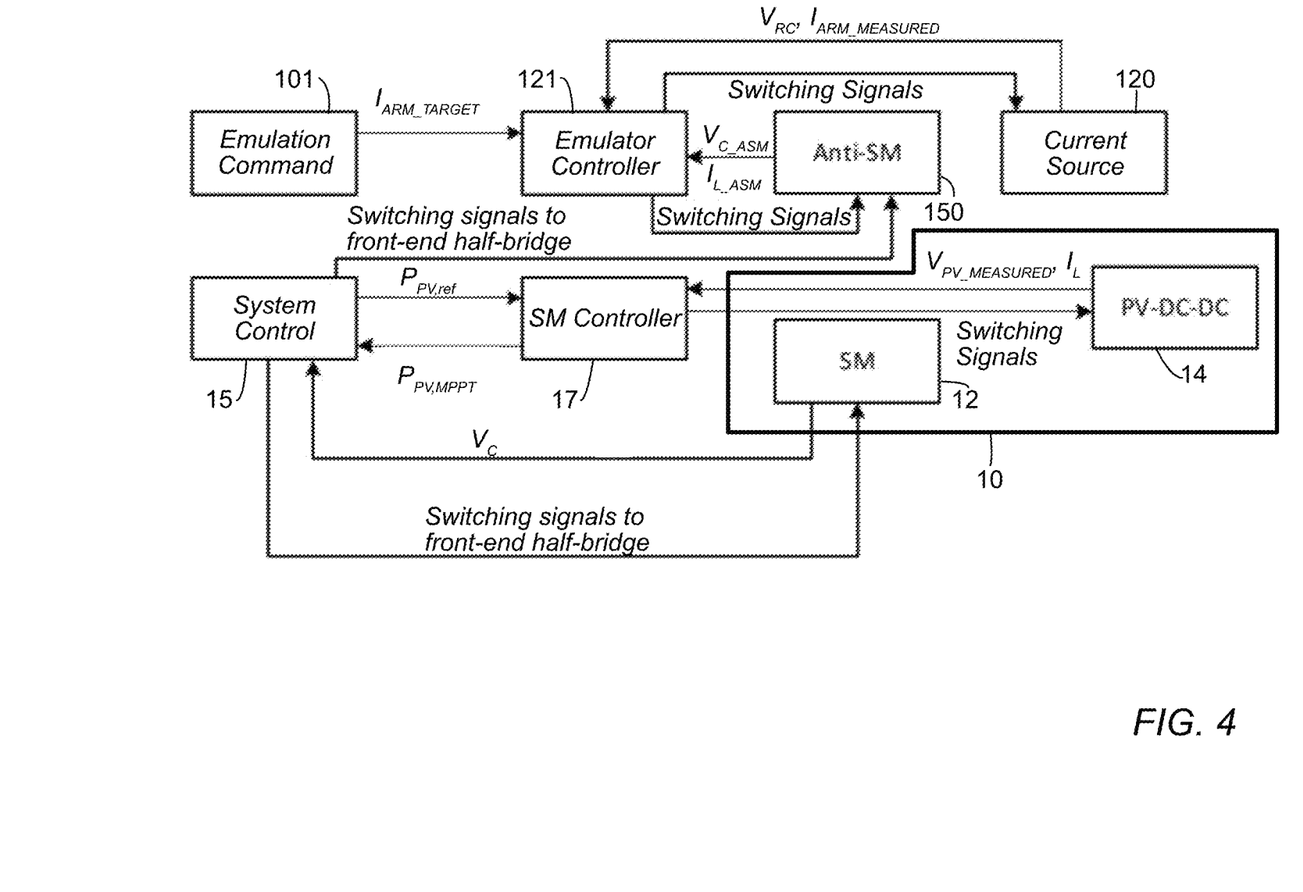
FIG. 4 shows an evaluation system in one embodiment according to the present disclosure.

The power electronics module 10 may include a front-end half bridge circuit (e.g., identified as the SM 12 in illustrated embodiment of FIG. 4) and a DC/DC converter 14 (as depicted in the illustrated embodiment of FIG. 4). The front-end half bridge circuit may be operable to receive and direct power through an arm of the MARS power plant 20. In the illustrated embodiment, the power electronics module 10 includes an input port and an output port. The input port may be operable to receive the arm current $I_{ARM}$ (which may be predetermined based on the MARS power plant 20 operating conditions), and the output port may be operable to generate voltage at a predetermined level in accordance with the SM 12 (e.g., the front and half bridge circuit), dc-dc converter 14, or the module power element 190, or a combination thereof.

The input port may share the same electrical connections to the arm of the MARS power plant 20 or to the evaluation system 100. In the illustrated embodiment of FIG. 2, the input port and the output port are coupled to the stress inductors 126, 128.

The dc/dc converter 14 may be configured to facilitate coupling power between the arm of the MARS power plant 20 and the module power element 190 of the power electronics module 10. For instance, with the power electronics module 10 including a PV-SM and a module power element 190 in the form of a PV, the front-end half bridge circuit and the dc-dc converter of the PV-SM may be operable to translate power generated from the PV for supply to the arm of the MARS power plant 20. As another example, with the power electronics module 10 including an ESS-SM and a module power element 190 in the form of an ESS, the front-end half bridge circuit and the dc-dc converter of the ESS-SM may be operable to translate power received via the arm of the MARS power plants 20 to charge the module power element 190. Additionally, the dc-dc converter of the ESS-SM may be bidirectional to obtain power from the module power element 190 and supply this obtained power to the arm of the MARS power plant 20.

III. Evaluation System

The evaluation system 100 in the illustrated embodiment of FIG. 1, as described herein, may be operable to emulate arm current $I_{ARM}$ present in a MARS power plant 20 for use in evaluating a power electronics module 10. The evaluation system 100 is shown in further detail in accordance with one embodiment in FIG. 2, and control aspects of the evaluation system 100 are depicted in FIG. 4.

The evaluation system 100 may be coupled to first and second power sources 110, 180. The evaluation system 100 may include a current source 120 and a filter 140 operable to supply current that emulates the arm current $I_{ARM}$ for evaluation of the power electronics module 10. The evaluation system 100 may also include switching circuitry 150 configured to maintain an output of the evaluation system 100, such as an output of the current source 120 or the filter 140, at a voltage less than a threshold voltage despite potential generation of high voltages from the power electronics module 10. As an example, the threshold voltage may be 1000 V for components of the current source 120 and the filters 140, and the power electronics module 10 may be capable of generating 1.6 kV, which is greater than the threshold voltage of 1000 V.

The current source 120 in the illustrated embodiment provides an amplifier circuit and may include an H-bridge with a plurality of switches S1, S2, S3, S4. The switches S1, S2, S3, S4 are SiC MOSFETs in the illustrated embodiment; however, the present disclosure is not so limited and the switches S1, S2, S3, S4 may be any type of switch. Additional switches described herein may be SiC MOSFETs or IGBTs or any other type or combination of types of switches. As described herein, there are several switches that are operable to be directed by one or more controllers. The switching methodology for activating the H-bridge circuit is pulse width modulation (PWM) in the illustrated embodiment; however, any type other switching methodology may be implemented. Activation of switches, such as the switches S1, S2, S3, S4 and the switches 151, 152, 153, 154, in accordance with one or more embodiments described herein, may be conducted by gate drive circuitry that may be provided with switching circuitry associated with the switches or a controller operable to direct operation of the switches.

The H-bridge may be operable by an emulator controller 121 to generate current that emulates the arm current $I_{ARM}$, which may be sinusoidal with a dc component as depicted in FIG. 1. The arm current $I_{ARM}$ may be predetermined based on an operating condition of the MARS power plant 20 or other circuitry being emulated. Alternatively, the arm current $I_{ARM}$ may be dynamic based on one or more sensed parameters.

The output from the current source 120 may be biased to a voltage $V_{OUT}$ based on operation of the H-bridge and its switches S1, S2, S3, S4. The output of the current source 120, in the illustrated embodiment may be coupled to the power electronics module 10 via the filter 140 and the switching circuitry 150. Together, the components coupled to the output of the current source 120 form a load having a load impedance $Z_{OUT}$. The current output from the current source 120 may be a function of the voltage of the first power source 110 and the load impedance $Z_{OUT}$, as well as operation of the H bridge by the emulator controller 121.

The current source 120 may be operable to generate the arm current $I_{ARM}$ based on a reference arm current that flows through a SM in the MARS power plant 20. This reference arm current may correspond to a predetermined current value for use in evaluation of the power electronics module 10. The predetermined current value may be provided by an emulation command controller 101. For instance, the emulation command controller 101 may provide the emulator controller 121 of the emulation system 100 with a current signal corresponding to a target arm current, and the emulator controller 121 may direct gate-drive circuitry to operate the switches S1, S2, S3, S4 to supply arm current $I_{ARM}$ in accordance with the target arm current. The emulation command controller 101 may be considered a signal generator operable to generate a current signal corresponding to the target arm current.

The emulator controller 121 may obtain feedback based on one or more sensors to control the arm current $I_{ARM}$ to track the target arm current received from the emulation command controller 101. For instance, the emulator controller 121 may obtain or sense one or more characteristics of power in the current source 120, such as a voltage (e.g., $V_{OUT}$) in the filter and current (e.g., $I_{ARM}$) through output of the current source 120. Sensor circuitry may be coupled to the current source 120 to provide such sensed feedback.

It is noted that the voltage of the first power source 110 (e.g., 600 V) has little relevance to operation of the power electronics circuit 10 and the switching circuitry 150 as described herein. Rather the voltage of the first power source 110 is provided in order to generate the arm current $I_{ARM}$ at the output of the current source 120, for a given load impedance $Z_{OUT}$. Operation of the H-bridge may vary depending on the power source 110 in order to achieve a target arm current $I_{ARM}$ for the given load impedance $Z_{OUT}$.

The source filter circuitry 122 may be coupled to the first power source 110 and the H-bridge to facilitate generation of the arm current $I_{ARM}$ without significant noise in the dc current from power source 110.

The filter 140 may be coupled to the output of the current source 120 to further facilitate generation of the arm current $I_{ARM}$ without significant noise in the current. For instance, the filter 140 may filter the harmonics generated by the H-bridge of the current source 120. In the illustrated embodiment of FIG. 1, the arm current $I_{ARM}$ is shown with and without noise before and after the filter 140 in a representative manner to illustrate noise suppression effects provided by the filter 140. The filter 140 may include first and second filter inductors 142, 144 and an RC filter 146. It is to be understood that the filter 140 may be configured differently from the circuit topology depicted in the illustrated embodiment. The filter 140, for instance, may include any arrangement of circuit components (passive or active, or a combination thereof) that facilitate reduction of noise.

In the illustrated embodiment, the power electronics module 10 is coupled to the evaluation system 100 via first and second stress inductors 126, 128. The first and second stress inductors 126, 128 may provide an SM output of the evaluation system 100.

The voltage $V_{SM}$ across the first and second stress inductors 126, 128, as discussed herein, may be significantly larger than a threshold voltage associated with components of the evaluation system 100. For instance, the voltage generated by the power electronics module 10 across the first and second stress inductors 126, 128 may be a multiple of the threshold voltage associated with the evaluation system 100, such as a 1.5×, 2.0×, or 3.0× multiplier. The threshold voltage associated with components of the evaluation system 100 may apply to a subset of such components, including for instance, components of the current source 120.

Figure 2:
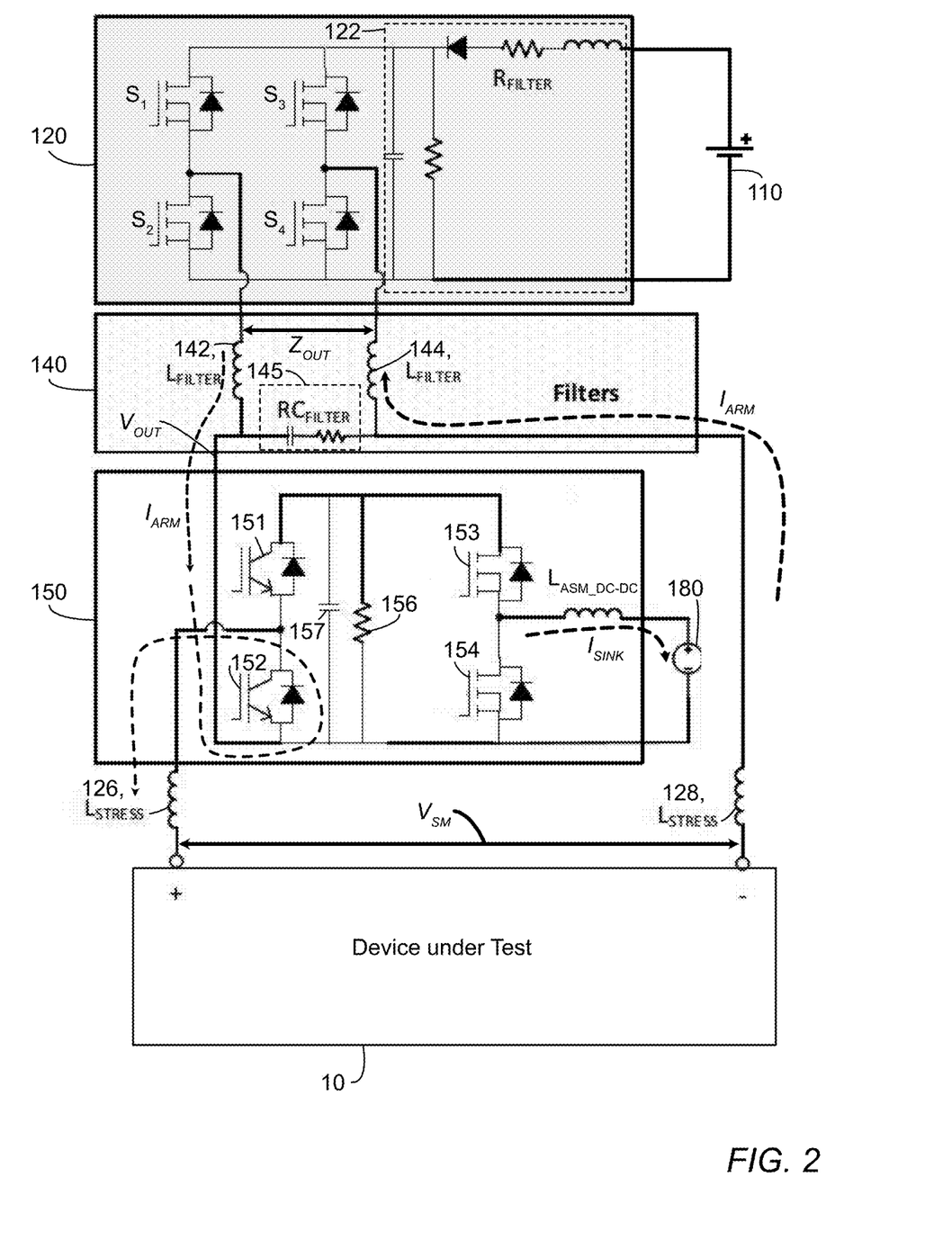
FIG. 2 shows an evaluation system in one embodiment according to the present disclosure.

In the illustrated embodiment of FIGS. 1 and 2, the evaluation system 100 includes switching circuitry 150 operable to facilitate maintaining a voltage across an output of the evaluation system 100 below a threshold voltage. As an example, the switching circuitry 150 in the illustrated embodiment may be operable to maintain the voltage $V_{OUT}$ across the output of the current source 120 at a value less than the threshold voltage. The threshold voltage may be 1000 V, and the switching circuitry 150 may be operable to substantially cancel or remove the voltage applied by the power electronics module 10 to the SM output of the evaluation system 100.

The switching circuitry 150 may correspond to amplifier circuitry operable to generate an amplifier voltage that is predetermined based on parameters associated with the power electronics module 10. For instance, the switching circuitry 150 may be operated to generate an amplifier voltage that corresponds to a predetermined voltage of the power electronics module 10, but is out of phase with the predetermined voltage of the power electronics module 10.

Alternatively, the voltage generated by the switching circuitry 150 may be dynamic based on one or more sensed characteristics.

It is noted that aspects of the evaluation system 100 are described herein as corresponding to amplifier circuitry, including the current source 120 and the switching circuitry 150. These aspects may be considered as amplifier circuitry, individually or collectively.

The switching circuitry 150 may be considered operable to provide anti-SM (ASM) functionality to cancel the voltage generated by the power electronics module 10 (e.g., the DUT). The switching circuitry 150 in the illustrated embodiment includes a dc-dc converter connected to the front-end half-bridge of the power electronics module 10, and is configured to sink the power generated or generate the power received by the power electronics module 10 (e.g., a PV-SM or ESS-SM, respectively). The switching circuitry 150 may include a front-end half bridge based on a plurality of switches 151, 152, at least a portion of which may conduct the arm current $I_{ARM}$ to the power electronics module 10.

The dc-dc converter of the switching circuitry 150 may include a plurality of switches 153, 154 configured to facilitate sinking a power generated or generating a power received based on a voltage of the second power source 180. The power consumed by the dc-dc converter may correspond in magnitude to, but out of phase with, the power generated by the power electronics module 10. Control of the dc-dc converter of the switching circuitry 150 may be conducted by the emulator controller 121.

The switching circuitry 150 in the illustrated embodiment includes a resistor 156 and a capacitor 157 operable as dc-link capacitor, and an inductor 155 to provide filter functionality.

In the illustrated embodiment of FIG. 4, the emulator controller 121 is shown operable to direct operation of the current source 120 and the switching circuitry 150. To direct such operation, the emulator controller 121 may supply control signals to the switches S1, S2, S3, S4 of the current source 120 and the switches 153, 154 of the switching circuitry 150, which correspond to the dc-dc converter of the switching circuitry 150.

The emulator controller 121 may include one or more emulator sensors each operable to detect a characteristic of power in the evaluation system 100. For instance, the emulator controller 121 may include a sensor operable to detect a voltage in the filter circuit 122 of the current source 120 to facilitate generation of the arm current $I_{ARM}$. As another example, the emulator controller 121 may include one or more sensors operable to detect the arm current $I_{ARM}$ and voltage in the filter circuit 140 to adjust operation of the current source 120 in order to achieve an arm current $I_{ARM}$ measured with the directives received from the emulation command system 101.

The emulator controller 121 may also include a sensor operable to detect a voltage across the capacitor 157 of the switching circuitry 150 of the basis for determining at least one of a voltage output from the power electronics module 10 and a deviation between the voltage in the switching circuitry 150 and a voltage of the power electronics module 10. The deviation may form the basis for controlling operation of the switching circuitry 150 to avoid applying a voltage from the power electronics module 10 to an output of the current source 120 that exceeds a voltage threshold associated with the output.

The system controller 15 of the evaluation system 100 in the illustrated embodiment of FIG. 4 may be operable to control operation of the power electronics module 10 and the switching circuitry 150. Specifically, in the illustrated embodiment, the system controller 15 is operable to supply a reference directed to an SM controller 17 indicating a target power output $P_{PV,REF}$ for the power electronics module 10. The SM controller 17 may direct operation of the power electronics module 10 in accordance with the target power output directives received from the system controller 15. The controller 17 may be coupled electrically to the power electronics module 10 in order to direct operation thereof, or may be coupled via a fiber optic connection to direct operation of the power electronics module 10. Likewise, the system controller 15 may be electrically coupled or use a fiber optic coupling with the switching circuitry 150 to direct operation thereof. The system controller 15 in the illustrated embodiment directly provides switching control signals to the SM 12—however, the present disclosure is not so limited such that the system controller 15 may direct operation of the SM 12 in any manner, including via a communication or direct signaling.

The SM controller 17 may provide, or the system controller 15 may sense, a measured power output $P_{PV,MPPT}$ from the power electronics module 10. The SM controller 17 may obtain a measured voltage $V_{PV}$ and current $I_L$ of a DC-DC converter 14 of the power electronics module 10, and supply control signals to the DC-DC converter 14 in accordance with the target power output $P_{PV,REF}$ received from the system controller 15.

The system controller 15 in the illustrated embodiment may obtain or sense a voltage of the SM 12 of the power electronics module 10. More particularly, in one embodiment, the voltage of the SM 12 may correspond to a voltage of a front end-half bridge of the SM 12. The system controller 15 may also supply switching signals to the SM 12 to control power output from the power electronics module 10 into the arm of the MARS power plant 20.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A system for characterizing a multiport autonomous reconfigurable solar (MARS) power plant to be formed from a plurality of power-electronic modules electrically connected in series to adjacent ones along one or more arms, each arm comprising one or more photovoltaic (PV) modules to be electrically connected to corresponding PV panels associated with the MARS power plant, one or more energy-storage system (ESS) modules to be electrically connected to energy storage associated with the MARS power plant, and at least one additional module different from both a PV module and an ESS module, the characterizing of the MARS power plant being performed using only a test module from among the one or more PV modules or the one or more ESS modules or the one or more additional modules, wherein the test module includes an input port and an output port, and wherein if the test module were operated as part of the MARS power plant, then an arm current through the test module would have predetermined current values, and a module voltage at the output port of the test module would have predetermined voltage values, the system comprising:
amplifier circuitry configured to:
electrically connect to the test module and, when connected to the test module,
output an amplifier current corresponding to the predetermined current values of the arm current, and
output, when providing the amplifier current to the test module, an amplifier voltage corresponding to the predetermined voltage values of, and being out of phase with, the module voltage.

2. The system of claim 1, wherein the amplifier circuitry includes:
current source circuitry including an H-bridge;
filtering circuitry electrically connected at outputs of the current source circuitry and configured to filter harmonics produced by the H-bridge;
module-voltage cancelation circuitry electrically connected to a first output of the filtering circuitry and configured to cause the amplifier voltage to correspond to the predetermined voltage values of, and to be out of phase with, the module voltage; and
a first stress inductor electrically connected between the output of the module-voltage cancelation circuitry and a first output of the amplifier circuitry; and
a second stress inductor electrically connected between a second output of the filtering circuitry and a second output of the amplifier circuitry.

3. The system of claim 2, wherein, when the test module includes a PV module that includes a front-end half bridge and a dc/dc converter, the module-voltage cancelation circuitry includes a corresponding front-end half bridge and a corresponding dc/dc converter.

4. The system of claim 3, wherein the amplifier circuitry includes gate-driver circuitry configured to drive gates of the H-bridge, gates of the front-end half bridge, and gates of the dc/dc converter.

5. The system of claim 4, wherein the amplifier circuitry includes:
controller circuitry configured to control the gate-driver circuitry based on a current signal corresponding to the arm current to cause currents at the outputs of the current source circuitry to follow the arm current.

6. The system of claim 5, wherein the amplifier circuitry includes sensing circuitry communicatively coupled to the controller circuitry and configured to:
measure the current through the outputs of the current source circuitry and a voltage in the filtering circuitry, and
feedback values of the measured current and voltage to the controller circuitry.

7. The system of claim 5, wherein the controller circuitry is communicatively coupled with a signal generator and configured to receive from the signal generator the current signal corresponding to the arm current.

8. The system of claim 1, wherein the MARS power plant includes:
hundreds of identical PV modules,
hundreds of identical ESS modules, or
hundreds of the additional modules.

9. An evaluation system for evaluating a power electronics module, the power electronics module capable of receiving power and generating a high-voltage output, the power electronics module operable, in a power system separate from the evaluation system, to generate and receive power in conjunction with a plurality of power electronics modules, the evaluation system comprising:
a current source operable to supply current to the power electronics module, the current source configured to direct power received from a first power source to the power electronics module, the current source including a source output configured for operation below a voltage threshold that is less than the high-voltage output of the power electronics module;
a controller operably coupled to the current source, the controller operable to direct supply of current to the power-electronics module; and
switching circuitry operably coupled to the current source and the power-electronics module, the switching circuitry operable to sink power produced by the power-electronics module into a second power source in order to maintain the source output at a voltage below the voltage threshold.

10. The evaluation system of claim 9 wherein the switching circuitry is configured to generate power, and wherein the power-electronics module is operable to sink power generated by the switching circuitry.

11. The evaluation system of claim 9 wherein:
the power electronics module is operable to generate a module voltage at the high-voltage output; and
the switching circuitry configured to generate an anti-module voltage that is out of phase with the module voltage.

12. The evaluation system of claim 11 wherein the anti-module voltage substantially cancels the module voltage of the power electronics module, and wherein the power output from the power electronics module is provided to the second power source.

13. The evaluation system of claim 9 wherein the first and second power sources are different.

14. The evaluation system of claim 9 wherein the second power source is a bidirectional power source.

15. The evaluation system of claim 9 wherein the current source includes inverter circuitry operable to supply current to the power electronics module via the source output at a source frequency and a source phase, wherein the current provided via the source output is based on a voltage output from the inverter circuitry and an impedance seen by the source output.

16. The evaluation system of claim 15 wherein the switching circuitry is operable to prevent the power electronics module from substantially affecting the impedance seen by the source output irrespective of whether the power electronics module is receiving or generating power.

17. A module switching system operable to cancel voltage and sink power output from a power electronics module, the power electronics module configured to receive current from a current source via a source output of the current source, the current source configured for operation below a voltage threshold that is less than a high-voltage output of the power electronics module, the module switching system comprising:

switching circuitry configured to be coupled to the current source and the power-electronics module, the switching circuitry operable to sink power produced by the power-electronics module into a power source, the switching circuitry operable in a first mode to maintain the source output at a voltage below the voltage threshold, wherein the power electronics module is generating voltage greater than the voltage threshold in the first mode; and a controller operably coupled to the switching circuitry, the controller operable to direct the switching circuitry, in the first mode, to direct power from the power electronics module to the power source.

18. The module switching system of claim 17 wherein the switching circuitry is configured to generate power, and wherein the power-electronics module is operable to sink power generated by the switching circuitry.

19. The module switching system of claim 17 wherein the controller is operable to direct the switching circuitry, in the first mode, to maintain the source output of the current source at a voltage below the voltage threshold.

20. The module switching system of claim 17 wherein the switching circuitry is operable in a second mode to allow the current source to provide current to the power electronics module.

21. The module switching system of claim 17 wherein the switching circuitry is operable to generate an anti-module voltage that is out of phase with voltage that is generated by the power electronics module.

22. The module switching system of claim 17 wherein the switching circuitry is a dc-dc converter operable to sink power generated by the power electronics module into the power source.

* * * * *